US012656433B2

(12) United States Patent
Setsompop et al.

(10) Patent No.: US 12,656,433 B2
(45) Date of Patent: Jun. 16, 2026

(54) DYNAMIC SHIM APPROACH TO CORRECT EDDY-CURRENTS AND CONCOMITANT FIELDS IN MAGNETIC RESONANCE IMAGING USING LOCAL SHIM COIL

(71) Applicants:The Board of Trustees of the Leland Stanford Junior University, Stanford, CA (US); The General Hospital Corporation, Boston, MA (US)

(72) Inventors: Kawin Setsompop, Stanford, CA (US); Adam Bruce Kerr, Menlo Park, CA (US); Xiaozhi Cao, Menlo Park, CA (US); Jason Stockmann, Cambridge, MA (US); Congyu Liao, Union City, CA (US)

(73) Assignees: The Board of Trustees of the Leland Stanford Junior University, Stanford, CA (US); The General Hospital Corporation, Boston, MA (US)

( * ) Notice: Subject to any disclaimer, the term of this patent is extended or adjusted under 35 U.S.C. 154(b) by 151 days.

(21) Appl. No.: 18/655,148

(22) Filed: May 3, 2024

(65) Prior Publication Data
US 2024/0369659 A1 Nov. 7, 2024

Related U.S. Application Data

(60) Provisional application No. 63/463,669, filed on May 3, 2023.

(51) Int. Cl.
G01R 33/3875 (2006.01)

(52) U.S. Cl.
CPC ................................ G01R 33/3875 (2013.01)

(58) Field of Classification Search
CPC .......... G01R 33/3875; G01R 33/56341; G01R 33/56518
(Continued)

(56) References Cited

U.S. PATENT DOCUMENTS

2006/0164082 A1* 7/2006 Foxall ................ G01R 33/3875
324/309
2007/0170917 A1* 7/2007 Thompson ......... G01R 33/5616
324/318

OTHER PUBLICATIONS

Chan, Rachel W., et al. "Characterization and correction of eddy-current artifacts in unipolar and bipolar diffusion sequences using magnetic field monitoring." Journal of Magnetic Resonance 244 (2014): 74-84. (Year: 2014).*
(Continued)

*Primary Examiner* — Christopher P Mcandrew
(74) *Attorney, Agent, or Firm* — LUMEN PATENT FIRM

(57) ABSTRACT

A method for magnetic resonance imaging includes performing a pre-scan using a spin-echo diffusion acquisition with a one-time MRI pulse sequence to measure phase differences between diffusion and non-diffusion acquisitions, which correspond to an estimation of eddy-current-induced phase in a diffusion-prepared sequence; and performing a scan using arbitrary waveform shim currents applied to a shim array during the acquisition, wherein the shim currents are determined from the measured phase differences from the pre-scan to create opposite phase maps to compensate eddy-current or system-imperfection-induced phase differences; wherein the scan and pre-scan are performed using an MRI apparatus with a channel integrated receiver and the shim array.

3 Claims, 12 Drawing Sheets

(58) Field of Classification Search
USPC ......................................................... 324/318
See application file for complete search history.

(56)                     References Cited

OTHER PUBLICATIONS

Liao et al., Flexible use of AC/DC coil for eddy-currents and concomitant fields mitigation with applications in diffusion-prepared non-Cartesian sampling. Oral presentation at ISMRM Jun. 2023.

Stockmann et al. A 32-channel combined RF and B0 shim array for 3T brain imaging. Magn. Reson. Med. 2016; 75:441.

Han et al. Integrated parallel reception, excitation, and shimming (iPRES). Magn. Reson. Med. 2013;70:241.

Juchem et al. Dynamic multi-coil technique (Dynamite) shimming for echo-planar imaging of the human brain at 7 Tesla. Neuroimage 2015;105:462.

* cited by examiner

Close-fitting AC/DC
shim coil helmet
on patient table

100

106

Cabling system

110

108

Shim amplifiers
Located in rear
pedestal

102

104

Shim optimization
Offline computer

MRI scanner console

In vivo diffusion-prepared multi-shot 3D-spiral imaging using AC/DC coil 2.0mm-iso DWI, b=2000 s/mm² , 3 diffusion directions w/o prepulse
w/o shim w/ prepulse
w/o shim w/ prepulse
w/ shim diff [1,0,0]        diff [0,1,0]        diff [0,0,1]

*Fig. 9*

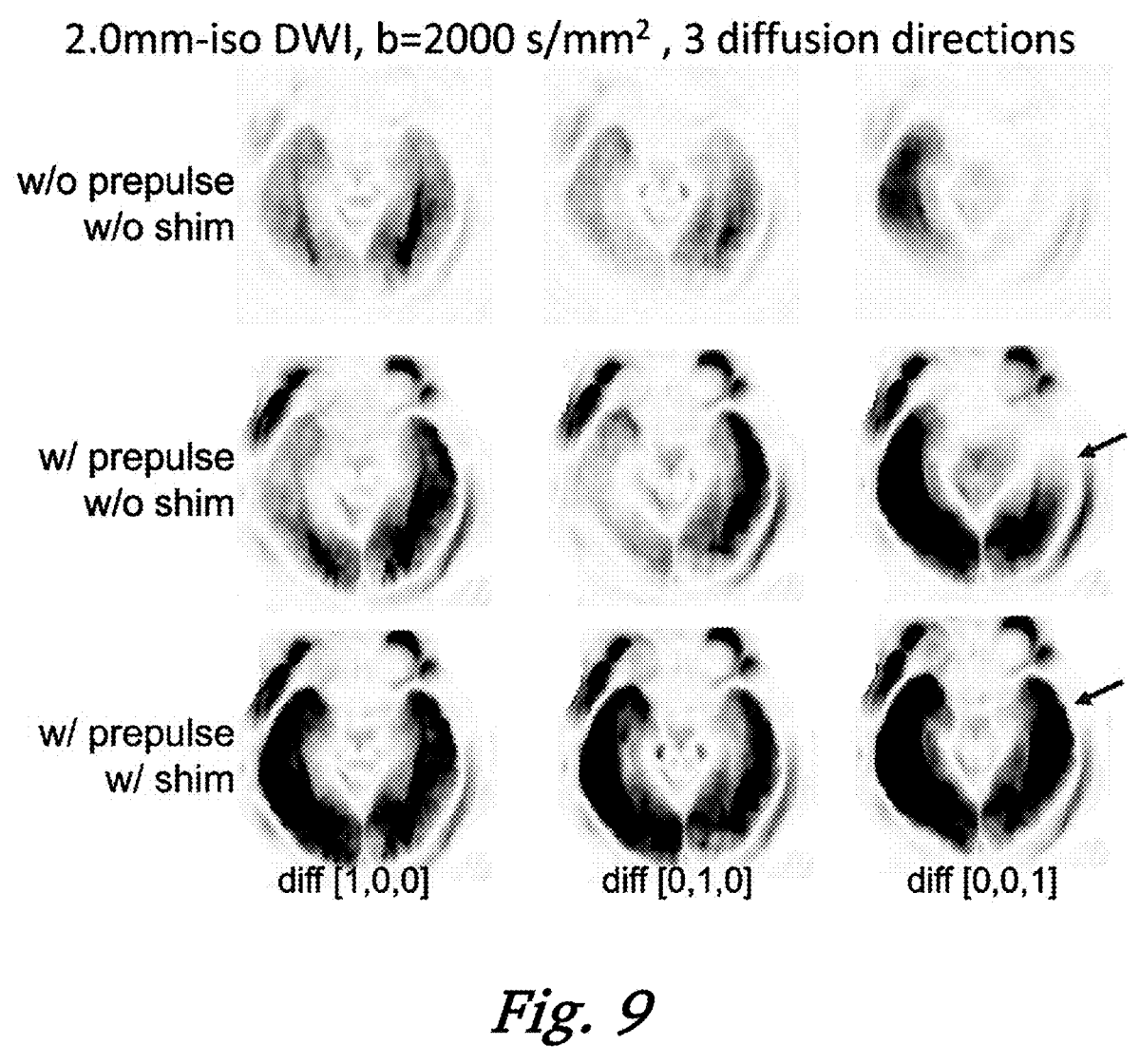

DYNAMIC SHIM APPROACH TO CORRECT EDDY-CURRENTS AND CONCOMITANT FIELDS IN MAGNETIC RESONANCE IMAGING USING LOCAL SHIM COIL

CROSS-REFERENCE TO RELATED APPLICATIONS

This application claims priority from U.S. Provisional Patent Application 63/463,669 filed May 3, 2023, which is incorporated herein by reference.

STATEMENT OF FEDERALLY SPONSORED RESEARCH

This invention was made with Government support under contract EB030006 awarded by the National Institutes of Health. The Government has certain rights in the invention.

FIELD OF THE INVENTION

The present invention relates generally to medical imaging techniques. More specifically, it relates to the use of shims in magnetic resonance imaging (MRI).

BACKGROUND OF THE INVENTION

Local multi-coil $B_0$ shimming (including AC/DC shim-arrays) has proven to be effective in enhancing $B_0$ homogeneity and reducing echo-planar imaging (EPI) distortions in structural, functional, diffusion, and fetal MRI applications. Conventional scanners are equipped with first-order (the linear gradients) and static second-order spherical harmonic shim coils, which generate a spatial magnetic profile to compensate low-spatial order $B_0$ fields over the target volume.

AC/DC shim-arrays employing small shim coils patterned around the imaged object have been introduced as a convenient way to provide rapidly-switchable, higher-order $B_0$ shimming without the need to modify the MRI scanner substantially. One notable advantage of the AC/DC shim-array is its ability to rapidly switch shim currents without introducing image artifacts. This allows for the optimization of $B_0$ shimming on a slice-by-slice basis, leading to improved $B_0$ homogeneity and reduced geometric distortion in EPI acquisition. Compared to traditional second-order shimming, the dual-purpose AC/DC shim-array provides both high spatial-order $B_0$ field control dynamically at a high temporal resolution as well as good parallel-imaging capability.

Diffusion MRI plays a crucial role in numerous neuroscientific and clinical applications. The effectiveness of dynamic $B_0$ shimming has been demonstrated using the AC/DC shim-array for significantly reducing local field inhomogeneity by more than 50%, as compared to the standard static second-order shimming in diffusion-weighted spin-echo EPI acquisitions. This dynamic shim approach can be further integrated with simultaneous multi-slice imaging, signal-to-noise ratio (SNR)-efficient EPI acquisition schemes, and advanced reconstruction techniques to achieve comprehensive whole-brain coverage while minimizing image distortion. For instance, dynamic shimming can be combined with multi-shot blip-up/down EPI acquisition and model-based reconstruction strategies. This combination provides distortion-free, in vivo diffusion MRI at 600 μm isotropic resolution, delivering high fidelity and sensitivity on a clinical 3T scanner. Although this approach addresses in vivo field inhomogeneity, it does not use the AC/DC shim-array for correcting other imperfections in MRI acquisitions, such as eddy currents and concomitant fields.

Strong diffusion-sensitizing gradients can induce eddy currents within the scanner bore, leading to spatiotemporal variations in both the magnitude and phase of the magnetic field. These variations depend on the strength and diffusion-direction of the diffusion-encoding gradients. The amplitude of the eddy current response varies based on each time constant and differs among different scanners. There are numerous approaches to address eddy current-induced artifacts, such as geometric distortions and blurring. These approaches include: (i) Temporal compensation of the input current waveform to the gradient coil, such as the pre-emphasis method; (ii) The utilization of self-shielded gradient coil designs; (iii) Post-processing techniques, such as the FSL 'eddy' tool, which corrects eddy current-induced distortions by leveraging the redundancy in directionally sampled diffusion data along a sphere to derive a model of eddy current-induced magnetic fields up to the third order; (iv) The use of a gradient impulse response function or an NMR field camera to measure eddy currents and subsequently incorporate these measurements into model-based reconstructions for eddy current correction. Field camera-based corrections have been successfully implemented in various imaging techniques, including EPI, spiral imaging, and other complex k-space trajectories.

Diffusion-prepared (DP) acquisition is another category within diffusion MRI. DP acquisitions employ a 90-degree tip-up pulse to convert diffusion-encoded transverse magnetization ($M_{xy}$) into longitudinal magnetization ($M_z$). This approach offers the advantage of high SNR with a short diffusion-preparation time and is compatible with various readout methods, including fast-spin-echo and steady-state sequences. However, due to shot-to-shot phase variations resulting from physiological noise (e.g. cardiac pulsations) and eddy currents during diffusion encoding, these phase variations in $M_{xy}$ are subsequently stored to $M_z$ by the tip-up pulse. Consequently, the stored phase variations lead to undesirable magnitude variations following subsequent excitations and readouts. To address this issue, various methods have been proposed: (i) A magnitude stabilizer is applied before the tip-up pulse to mitigate shot-to-shot magnitude variations. However, this approach comes at the cost of losing half of the acquired signals because the magnitude stabilizer disperses transverse magnetization $M_{xy}$ before the tip-up pulse, leaving only the "net" $M_{xy}$ signals stored in longitudinal magnetization $M_z$. (ii) To avoid signal loss, techniques such as cardiac-gating and M1 or M2-compensated diffusion gradients are used to reduce physiological-induced phase variations. Additionally, a pre-pulse method, which implements a large pulsed gradient before the diffusion-preparation module, can generate significant eddy currents to compensate for eddy currents originating from diffusion gradients. However, the pre-pulse method may not adequately compensate for eddy currents, particularly at high b-values, limiting its applicability in DP acquisition.

Similar to eddy currents, concomitant fields resulting from gradient encoding can introduce additional phase accrual during acquisition, which results in image blurring and artifacts, particularly in acquisitions on high-performance gradient coil systems and low-field scanners, where such fields can be large. To address the issue of concomitant fields, a two-step approach is typically employed. First, the spatially varying concomitant fields are calculated using Maxwell's equations and the gradient coil settings. Subsequently, compensation is applied via sequence modification and/or further image reconstruction for phase error correction. These methods have proven successful in compensating for concomitant fields on low-field scanners, as well as with both symmetric and asymmetric gradient coils. However, it is worth noting that these compensation methods either require additional gradient blips with reduced scan efficiency, require extra image reconstruction correcting for phase error accruals during the readout, or are most effective for axial acquisitions with a specific positional offset along the z-axis only. Thus, it is still challenging to compensate complicated concomitant fields with oblique slice orientations positions or in simultaneous multi-slice acquisitions without the need of pulse sequence or reconstruction modification.

SUMMARY OF THE INVENTION

During magnetic resonance imaging (MRI) acquisitions, eddy-current and concomitant fields from gradient encoding can cause additional phase accrual, which results in image blurring/artifacts, particularly in acquisitions on emerging high-performance MRI systems with powerful gradient hardware, asymmetric gradient coils (including heat inserts), and low-field MRI scanner with strong concomitant fields.

The multi-coil shimming (AC/DC coil) has already been shown to provide improved magnetic field homogeneity to mitigate EPI distortions for structural, functional and diffusion MRI applications. This dual-purpose AC/DC coil provides both high spatial-order field control dynamically at a high temporal resolution as well as good parallel-imaging capability. However, these existing methods and devices are not used for eddy-current and concomitant field corrections.

Described herein is a technique for the flexible use of the AC/DC coil for eddy-currents and concomitant fields corrections in MRI acquisitions. Such a correction during the data acquisition process results in significant improvement in image reconstruction quality over the postprocessing/editing approaches that are currently being used.

More specifically, described herein is a dynamic shim approach with an integrated receiver and shim array hardware to correct undesirable spatial phase modulations from eddy-current and concomitant fields. We demonstrate its application in correcting undesirable eddy-currents from diffusion-encoding and concomitant gradient field with a long readout in MRI acquisitions. This approach also can be applied using other hardware with local $B_0$ fields, such as non-linear gradients and multi-coil shim systems. By using many independently-driven current loops, shim arrays can generate tailored non-linear fields, thus extending spatial encoding capability beyond that of the linear gradients supplied with conventional MRI scanners.

In one aspect, the present invention provides method for magnetic resonance imaging comprising: a) performing a pre-scan using a spin-echo diffusion acquisition with a one-time MRI pulse sequence to measure phase differences between diffusion and non-diffusion acquisitions, which correspond to an estimation of eddy-current-induced phase in a diffusion-prepared sequence; and b) performing a scan using arbitrary waveform shim currents applied to a shim array during the acquisition, wherein the shim currents are determined from the measured phase differences from the pre-scan to create opposite phase maps to compensate eddy-current or system-imperfection-induced phase differences; wherein the scan and pre-scan are performed using an MRI apparatus with a channel integrated receiver and the shim array. The shim array preferably comprises high-order shim coils or multi-coil shim arrays. The method may further comprise c) performing a third scan by applying arbitrary waveform shim currents to the shim array during a 2D, 3D, and simultaneous multi-slice MRI acquisition, in order to correct phase accrual and image blurring induced by concomitant fields from arbitrary imaging positions.

Disclosed are three aspects of this approach:

(i) Example of the hardware that can be used to perform this correction: a 46-channel integrated receiver and shim array (AC/DC coil) is built as an MRI device to provide dynamically updated shim currents to correct eddy-currents and concomitant field. The AC/DC coil is designed so as to cause minimal interference with the transmit RF fields from the scanner body coil. The hardware includes coil elements, helmet, receiver and shim sockets, and shim amplifier of the 46-channel AC/DC coil. The small shim coils are patterned around the imaged object and the shim amplifier is placed underneath the rear pedestal as a convenient way to provide higher-order shimming without the need to modify the MRI scanner substantially. Cables are routed along the patient table caterpillar to supply currents from the amplifiers to the coil.

(ii) Data acquisition approach to obtain information about the undesirable phase modulations that are to be corrected: A one-time MRI pulse sequence is implemented as a fast pre-scan MRI software to characterize eddy-currents induced from gradient system. A spin-echo diffusion acquisition is used to measure phase differences between diffusion and non-diffusion acquisitions, which correspond to an estimation of the eddy-current-induced phase in a diffusion-prepared sequence. Similar to the eddy-current correction, the time-varying concomitant-field-induced phase differences can be calculated from Maxwell's equations.

(iii) Approach to perform the phase correction during the data acquisition: The extracted phase differences from (ii) are then utilized for shim currents optimization. The optimal shim currents of the AC/DC coil are computed to create opposite phase maps to compensate the phase differences. The shim currents update dynamically through external triggers of the MRI pulse sequence, which enable compensation of differing eddy-currents from different diffusion-directions and concomitant fields. While initially realized using constant DC shim currents to apply the desired background phase modulation, the technique can also be used with time-varying current waveforms on each shim channel to null decaying eddy current fields in real time.

Conventional MRI devices can be modified to use this technique to correct undesirable eddy-current and concomitant fields effect in MRI acquisitions, and hence reduce MRI artifacts and improve image quality. This technology will be particularly important for the emerging MRI systems with i) powerful gradient systems, and ii) low and mid-field MRI systems.

While realized here using an AC/DC style shim coil, this eddy current and concomitant field nulling technique can be implemented using any suitably-rich basis set of magnetic field sources inside the scanner bore, including arrays of shim-only multi-turn shim coil loops or shim inserts capable of generating rapidly-switchable higher-order spherical harmonic fields.

The shim array may also be used to generate fields to counteract imperfection in gradient fields used for image encoding (e.g., gradient non-linearity).

BRIEF DESCRIPTION OF THE DRAWINGS

FIG. 9 shows diffusion-prepared (DP) images with and without shim and prepulse corrections.

DETAILED DESCRIPTION OF THE INVENTION

Described herein is a dynamic $B_0$ shim approach using 46-channel AC/DC shim array hardware to correct eddy current-induced phases from diffusion-encoding gradients and concomitant fields with a long spiral readout. The technique is illustrated using a 46-channel AC/DC shim array and corresponding amplifier system. Fast prescan spin-echo sequences with and without diffusion-encodings are introduced to measure eddy current-induced phase differences between diffusion and non-diffusion-weighted images. The measured phase differences are set as the target of the shim optimization to generate opposite phase maps to compensate the eddy current-induced phase differences of the multi-shot 3D diffusion-prepared acquisition. To compensate for concomitant fields, the optimal shim currents are updated to create opposite phase every 2 ms.

The AC/DC shim-array can be flexibly used to correct undesirable eddy current and concomitant fields effect in MRI acquisitions, with simulation results showing its effectiveness at mitigating concomitant fields in non-cartesian trajectories, such as spiral. Phantom and in vivo experiments with the AC/DC shim-array demonstrate whole-brain cardiac-gated, multi-shot 3D diffusion-prepared acquisition without the need for magnitude stabilizers.

This technique adopts a synergistic approach by using the AC/DC shim-array to correct eddy currents and employing M1-compensated diffusion-preparation with cardiac gating to correct physiological noise. Compared to a magnitude stabilizer, which results in the loss of half of the signal, this approach effectively minimizes shot-to-shot magnitude variations without sacrificing signal. It enables robust diffusion MRI with a short diffusion-preparation time while retaining the full signal level.

The flexible use of the AC/DC shim-array is able to provide both eddy currents and concomitant field corrections in MRI acquisitions. For eddy current compensation, we demonstrate feasibility for experimental cardiac-gated diffusion-prepared multi-shot 3D-acquisition. For concomitant field correction, our simulation results demonstrate the capability of using an AC/DC coil to compensate concomitant fields from a double-oblique slice using a long readout 2D spiral sampling with a high-performance gradient.

AC/DC Shim-Array Design

Figure 1A:
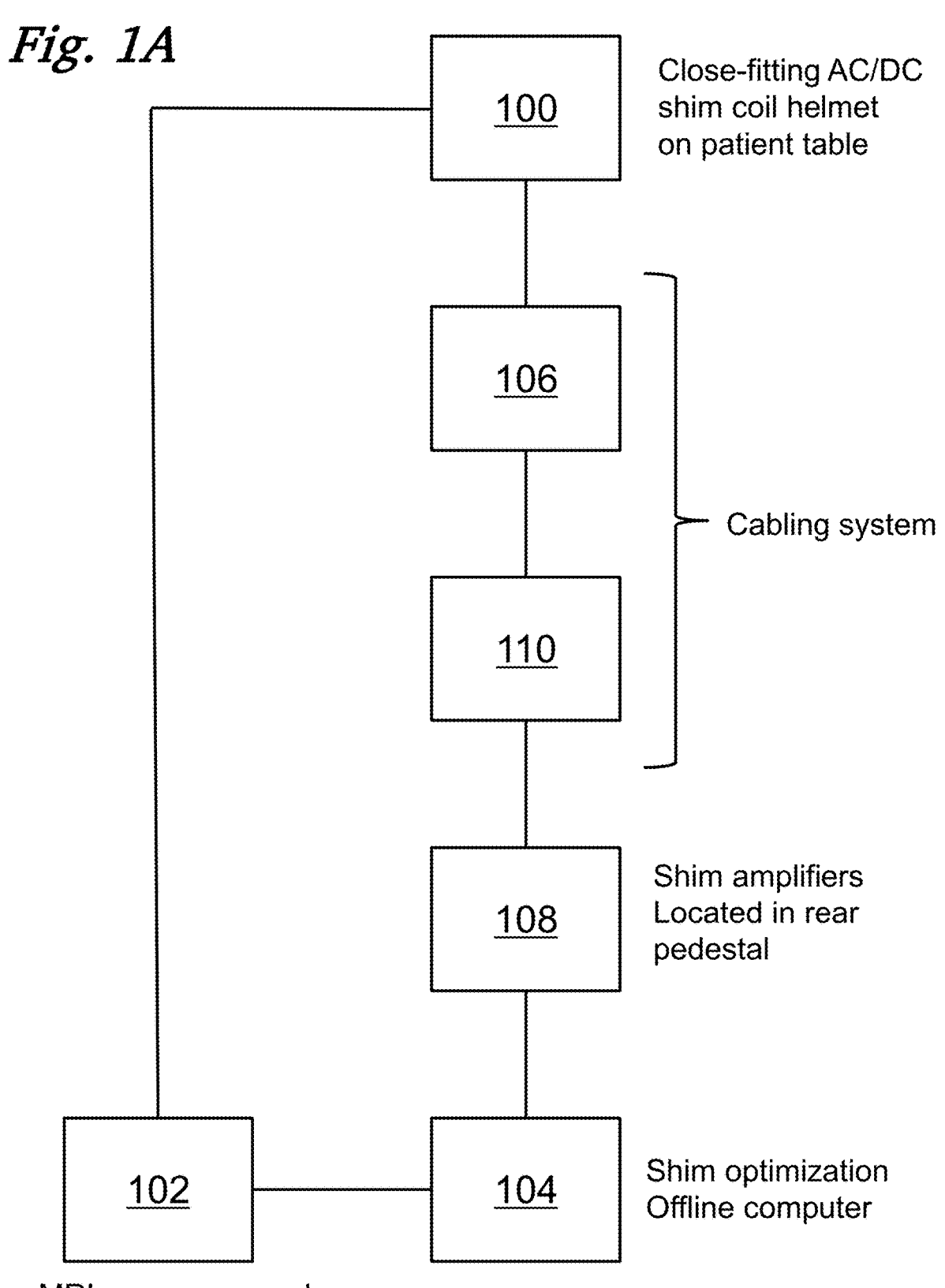
FIG. 1A is a block diagram showing MRI hardware system components and their connections, according to an embodiment of the invention.

FIG. 1A is a schematic block diagram showing the design of the 46-channel AC/DC shim-array according to an embodiment of the invention. Close-fitting AC/DC shim coil element loops 100 are positioned on the patient table. The coils 100 are connected to ODU-brand shim amplifier sockets 106 integrated into the scanner patient table head right next to the RF sockets. The shim supply cables are routed through a flexible caterpillar cable guide 110 to a 48-channel shim amplifier 108 mounted inside the scanner's rear pedestal. Receiver and shim sockets of the coil and shim amplifiers are installed seamlessly into the space behind the MRI scanner. The placement of small shim coils around the imaged object, along with the positioning of the shim amplifier beneath the patient table offers a convenient means to implement higher-order shimming without requiring significant modifications to the MRI scanner. Shim amplifiers 108 are connected to shim optimization offline computer

104. MRI scanner console 102 connects to the shim optimization computer as well as to the shim coils 100.

Figure 1B:
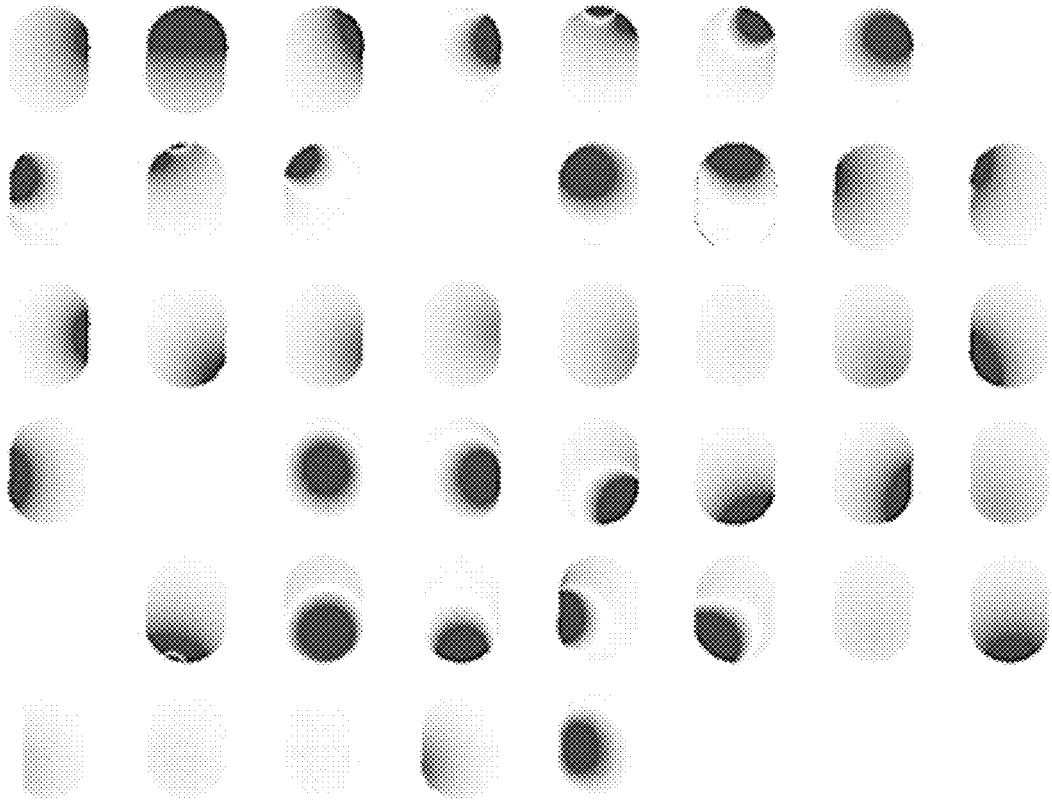
FIG. 1B shows an acquired calibration $B_0$ map basis set on a single slice, according to an embodiment of the invention.

Setting up the 46-channel AC/DC shim-array involves the following steps: (i) Inserting a large-field-of-view (FOV) phantom into the coil. (ii) Acquiring a $B_0$ mapping using a multi-echo gradient-echo sequence for each individual shim coil while varying the currents on a coil-by-coil basis. This step allows us to establish a $B_0$ map basis set for each shim coil, reflecting the sensitivity of field control for each individual coil (units of Hz/ampere). FIG. 1B illustrates the calibration $B_0$ map basis set for a single slice. Each oval in the figure is a plot of a $B_0$ field map acquired in a silicone oil phantom. The phantom is shaped to fill the entire interior of the AC/DC coil helmet allowing us to map the $B_0$ field offset generated by each coil element in the array, providing a basis set of maps in Hz/Ampere to use for $B_0$ shim optimization experiments. Since the $B_0$ fields generated by the coils do not change significantly in vivo, we only need to map them once during an initial calibration scan, and then we can use these maps for all subsequent experiments, as long as we know the position of the AC/DC coil in the magnet bore with respect to the gradient isocenter. (iii) Performing tests of transmission safety test to ensure there is no interference between the transmit RF volume coil and the AC/DC coils, no significant component heating on the AC/DC coil, as and no specific absorption rate (SAR) issues during scans. These steps are necessary only during the initial setup of the AC/DC shim-array.

Figures 2A, 2B:
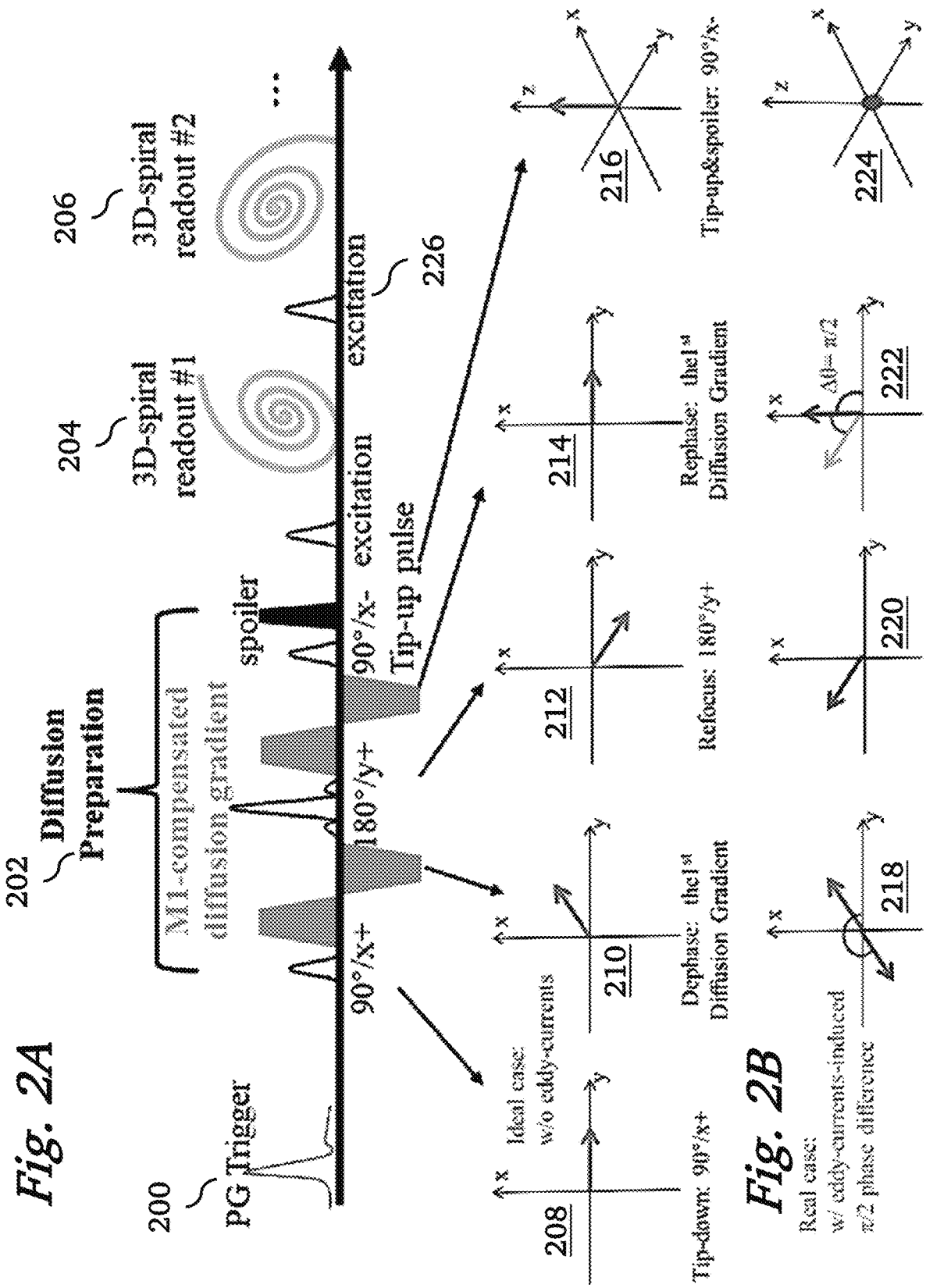
FIG. 2A illustrates a sequence diagram of a typical diffusion-prepared sequence.
FIG. 2B illustrates a demonstration of signal loss of diffusion-preparation acquisition due to phase differences, according to an embodiment of the invention. Note, in this example, the eddy current induced phase error is close to $\pi/2$, causing the tip-up pulse to incorrectly tip $M_z$ down instead of up, creating a $-\pi$ phase in the resulting DP images.
Figure 2C:
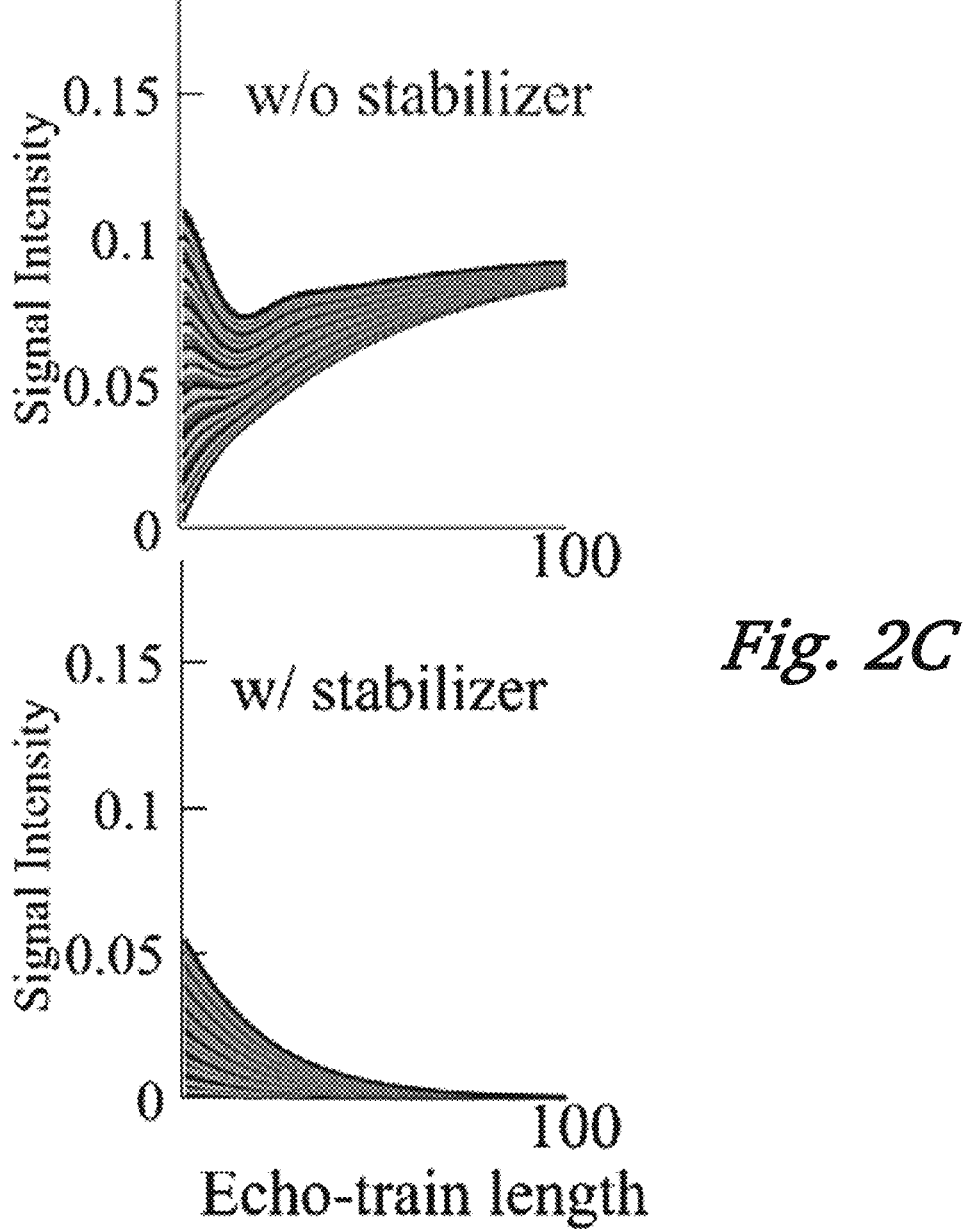
FIG. 2C shows signal evaluations with and without magnitude stabilizer. Given $T_1/T_2$=800/60 ms, $M_{xy}$ of the 1st TR=0.0816 without stabilizer while the $M_{xy}$ of the 1st TR=0.0408 with stabilizer.

Eddy Currents Correction Using AC/DC Shim-Array in Diffusion-Prepared Acquisition Eddy current-induced phase variations can lead to signal loss following the tip-up pulse. FIG. 2A illustrates a typical pulse sequence diagram for DP acquisition. It includes a PG trigger 200, diffusion preparation 202, 3D-spiral readout #1 204, and 3D-spiral readout #2 206. Also included are several excitation pulses 226. The diffusion preparation 202 includes 90°/x+, 180°/y+, 90°/x− pulses. The first 90°/x+ pulse is an excitation pulse intended to flip all the magnetization into the transverse plane. Diffusion gradient encode lobes are then applied before and after a 180°/y+ refocusing pulse to provide the diffusion contrast prep. The 90°/x− pulse then tips the prepared magnetization back up along the longitudinal axis (this works as long as all the spins are in phase). Then the spatial encoding module is played, using in this case a series of low-flip excitation pulses followed by spiral readouts, but generalizable to any FLASH-style readout. The present example sequence uses 3-D encoding rather than slice-selection. Ideally, in the absence of eddy current-induced phase variations, all diffusion-encoded signals can be completely stored in longitudinal magnetization $M_z$ with the tip-up pulse. Subsequent to the DP module, consecutive excitations are implemented, and the stored diffusion-weighted signals are flipped down to the transverse plane and acquired until the next electrocardiogram-gating (ECG) trigger or pulse oximeter-gating (PG) trigger occurs. However, when there is a spatially varying phase error induced by eddy currents, the tip-up pulse may fail to flip all transverse magnetizations back to the longitudinal axis, resulting in signal loss. FIG. 2B demonstrates signal loss in diffusion-preparation acquisition due to π/2 phase differences. Graphs 208-224 illustrate what can go wrong in practice when eddy currents impart additional unwanted phase to the spins during the diffusion preparation module. The first row of plots 208, 210, 212, 214, 216 shows the theoretical case where there are no eddy currents and the spins after the diffusion prep are aligned perfectly along the desired y-axis in plot 214, allowing the tip up pulse (90°/x−)

to perfectly nutate the spins back up to the longitudinal axis without loss of signal (plot 216). If any spins are not aligned with the y-axis due to eddy currents, some spins will be "left behind" by the tip up pulse and subsequently need to be spoiled/crushed with a gradient lobe, causing loss of signal. This non-ideal case in the presence of eddy currents is shown in the second row of plots 218, 220, 22, 224, leading to much lower longitudinal magnetization in plot 224 just before the spatial encoding module begins. This is the problem we seek to correct in this specific pulse sequence. But the technique can be applied more broadly to any unwanted spatially-varying phase accrual caused by eddy currents or concomitant fields. We use the 3D diffusion preparation sequence in FIG. 2A as an example where this technique clearly improved SNR in the images by using the shims to correct for the eddy-current induced phase accrual between spins over the FOV. The shim array is well suited to this task because it can emulate nonlinear field profiles across the FOV and is not limited to generating just linear field gradients. It's important to note that if the phase error is close to π/2, it can result in 100% signal loss after the tip-up pulse. A magnitude stabilizer pulse can mitigate such magnitude variations at the cost of halving the acquired signal. FIG. 2C presents signal evaluations with (bottom) and without (top) the magnitude stabilizer. The plots are in arbitrary units of signal intensity for the final image. Given $T_1/T_2$=800/60 ms, the transverse magnetization $M_{xy}$ for the 1st TR is 0.0816 without the stabilizer, while $M_{xy}$ for the 1st TR is 0.0408 with the stabilizer, indicating a 50% signal loss with the magnitude stabilizer in DP. Cardiac-gating combined with M1-compensated diffusion-gradients helps minimize phase-disruptions, and a pre-pulse gradient applied before DP is used to counteract eddy current-related phase-disruptions. Nonetheless, its efficacy is not robust, particularly at high-b-values. In this work, we synergistically used the AC/DC shim-array to correct the eddy currents and M1-compensated diffusion-preparation with cardiac gating rather than a magnitude stabilizer to minimize physiological noise-induced shot-to-shot magnitude variations, enabling robust diffusion MRI with a short diffusion-preparation time and full signal level.

Figures 3A, 3B:
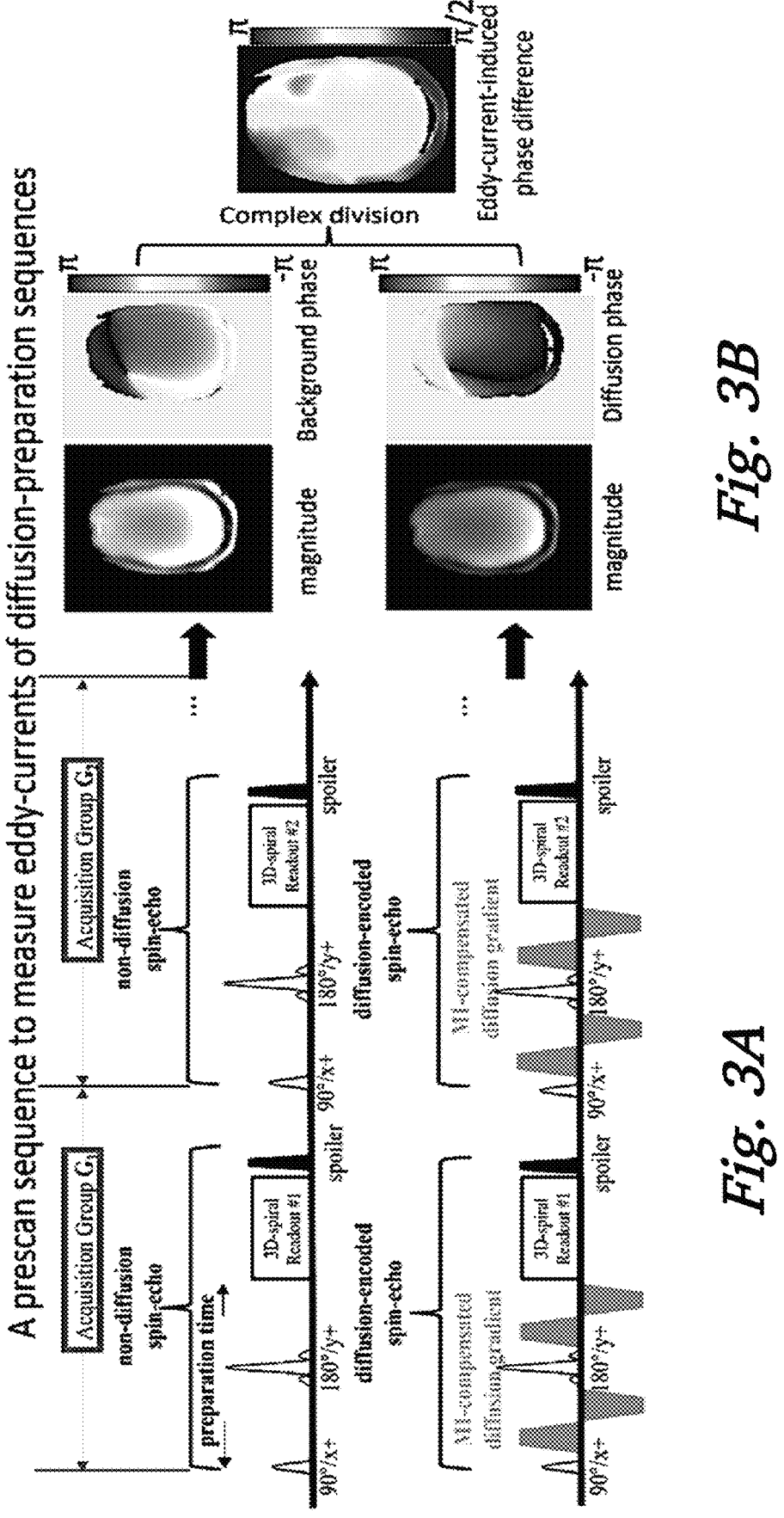
FIG. 3A shows a prescan spin-echo sequence to measure eddy current-induced phase differences, according to an embodiment of the invention.
FIG. 3B are images that illustrate how the phase differences can be extracted by complex division between diffusion-weighted and non-diffusion images.

The eddy currents correction includes the following steps:
(i) A one-time eddy current-induced phase characterization: A spin-echo diffusion acquisition, as shown in FIG. 3A, was implemented as a fast prescan to measure phase differences between b=0 and diffusion-weighted acquisitions in a head-shaped phantom, which corresponds to an estimation of the eddy current-induced phase in a diffusion prepared sequence, as shown in FIG. 3B. We run the 3D acquisition twice in order to obtain two sets of phase images: (i) baseline phase images with no diffusion preparation gradient pulses and (ii) phase images showing phase offsets caused by the eddy currents from the diffusion preparation pulses, which are not properly refocused by the 180°/y+ pulse. The difference between the baseline and diffusion-preparation images is used to generate the target field profile for the shim optimization. The shims are then blipped with the appropriate currents on each channel to generate a matching field profile in space, but inverted in amplitude. The shim encoding blip is φ=2πfτ, where φ is the negated target field phase, f is the superposition of the AC/DC coil shim fields, and τ is chosen so as to provide the correct gradient moment. There is more than one combination of scaled shim fields, f, and flip durations, τ, to generate the needed phase accrual, φ.

Figure 4:
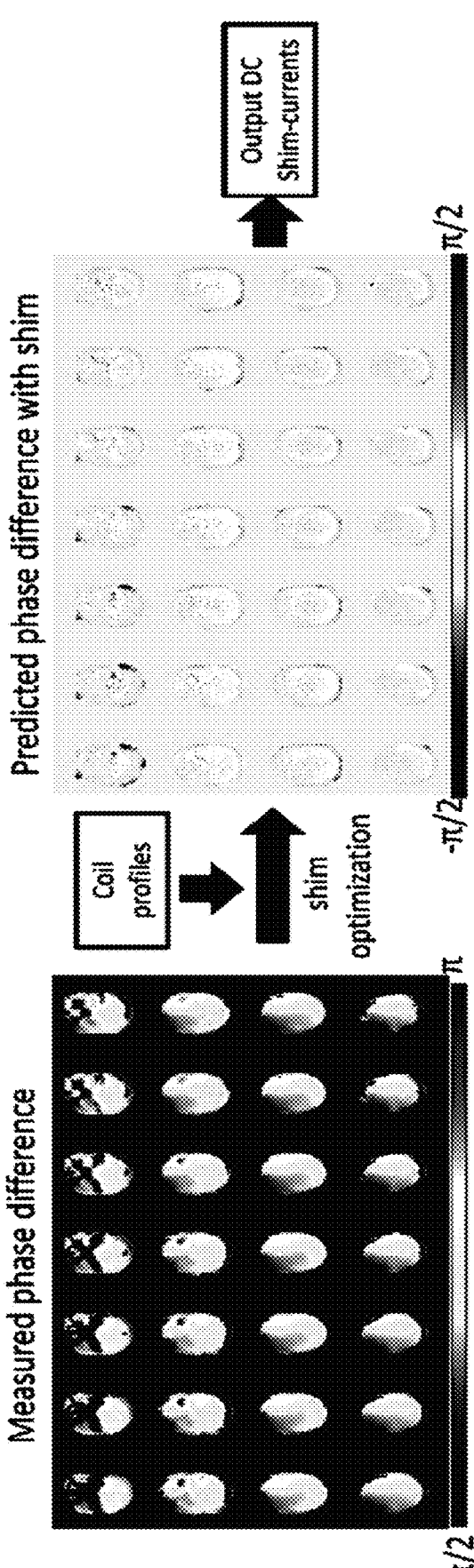
FIG. 4 is a schematic diagram illustrating how the measured phase differences were set as the input of the shim optimization, to create opposite phase variations to compensate the eddy current-induced phase differences.

(ii) The extracted phase difference from (i) is set as the input of DC-shim currents optimization. The optimal DC shim currents of the AC/DC shim-array are then computed using the calibration $B_0$ map basis set, to create opposite phase maps to compensate the eddy current-induced phase differences. FIG. 4 shows the prescan measured phase difference between non-diffusion and diffusion acquisitions, and the predicted phase difference with shimming. With the shim optimization, the eddy current-induced phase differences were minimized to zero, which compensated eddy currents in DP acquisition. During the diffusion-encoding in the DP module, the shim duration was set to 5 ms.

Figure 5:
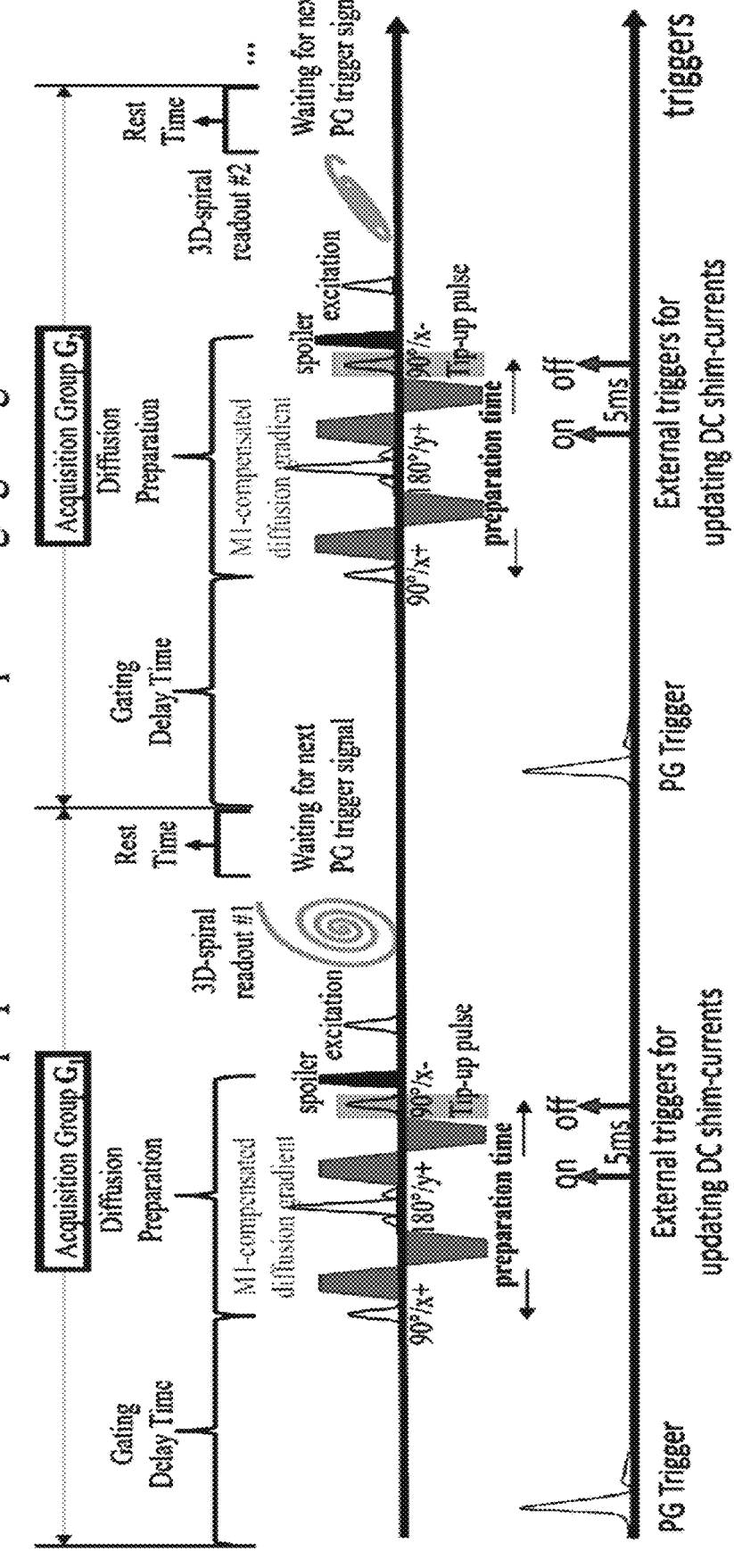
FIG. 5 shows cardiac-gated, M1-compensated diffusion-prepared multi-shot 3D spiral-projection sequence with AC/DC shim-array. Tailored shim currents were applied during a 5 ms-duration interval marked by external triggers, to correct for eddy current-induced phase error prior to the tip-up RF pulse. A pulse oximeter-gated (PG) trigger was employed to counteract the phase instabilities caused by cardiac pulsations during the diffusion-preparation.

(iii) The calculated shim currents are applied during the diffusion-encodings of the diffusion-prepared sequence that has the same diffusion encodings as the prescan in (i). The shim currents update every TR through external triggers of the sequence, shown in FIG. 5, which enables compensation of differing eddy currents from different diffusion-directions. For in vivo diffusion acquisition, a PG trigger was implemented to minimize cardiac pulsation induced phase instability during the DP. FIG. 5 shows the 3D diffusion preparation sequence that was already illustrated in previous plots, except this time with the addition of synchronization trigger pulses that instruct the shim amplifier system when to turn ON and turn OFF the shim currents for the eddy current phase compensation blips. These triggers are analogous to the beginning and end of a conventional gradient pulse on the scanner's gradient coils. The shim coil acts as an additional spatial encoding device that is synchronized with the scanner's acquisition (but with more degrees of freedom for shaping the applied B-field shim offset).

Concomitant Fields Correction Using AC/DC Shim-Array in Non-Cartesian Sampling

Concomitant fields arising from gradient encoding can introduce additional phase accumulation during the readout. From Maxwell's equations, the concomitant field $B_c$ for symmetric gradient hardware is approximated to the second order of Taylor series expansion of magnet field B, which can be expressed as:

$$B_c(t) \approx \left( \frac{Gz(t)^2}{8B_0} \right)(X^2 + Y^2) + \tag{1}$$
$$\left( \frac{Gx(t)^2 + Gy(t)^2}{2B_0} \right)Z^2 - \left( \frac{Gx(t)Gz(t)}{2B_0} \right)XZ - \left( \frac{Gy(t)Gz(t)}{2B_0} \right)YZ$$

where $B_0$ is the main magnetic field, $(Gx(t), Gy(t), Gz(t))$ are the time-dependent linear gradient fields of three axes and $(X, Y, Z)$ are 3D spatial coordinates in the magnet. Using this equation, we can simulate the concomitant field for arbitrary trajectories at arbitrary positions at a given time-point, denoted as t. Eq. 1 demonstrates that the concomitant field accumulates over acquisition time. This accumulated concomitant field introduces an additional phase during the readout, which in turn leads to image blurring, signal loss, and artifacts. The image degradation becomes particularly pronounced when using high gradient strengths, extended readout durations, and large offsets from the imaging isocenter.

To address the blurring caused by concomitant fields, we provide a dynamic approach for compensating the additional phase using the AC/DC shim array. This approach may be implemented by the following steps: (i) Given the gradient waveforms of the acquisition trajectories and slice position, we simulate concomitant fields across time using Eq. 1. To account for the temporal switch limits of the AC/DC shim array, the temporal resolution of the simulation is set to 2 ms. The temporal switching of the AC/DC coil shim amplifiers is estimated to take around 1 ms. We leave 2 ms to allow a little bit of settling time so that the field stabilizes fully before the next event in the scanner pulse sequence (e.g., RF pulse, ADC window, etc.). This 2 ms delay is specific to the hardware setup used in our experiments and is not intrinsic to the eddy current nulling approach. In future generations of our shim amplifier hardware, we plan to have much faster switching times on the order of ~50 us for example. (ii) The trajectories are segmented at intervals of 2 ms, and the accumulated phase per segment is determined by integrating the concomitant fields over the $\Delta t = 2$ ms segment, expressed as:

$$2\pi \int_t^{t+\Delta t} B_c(t)dt.$$

(iii) The phase increments obtained for all segments are then fed into a shim optimization algorithm to minimize them to zero. Similar to eddy current correction, the resulting optimal shim currents are updated every 2 ms upon receiving external triggers. This updating process generates opposite phase maps for each segment, effectively compensating for the concomitant fields segment by segment during the readout.

Imaging Protocols and Simulations

To validate the present method, we conducted both phantom and in vivo datasets acquisitions. The acquisition parameters are: FOV=$220 \times 220 \times 220$ mm$^3$, slice thickness=2.0 mm, 64-shot 3D spiral-projection sampling trajectories were sampled over $k_x$-, $k_y$- and $k_z$-axis to cover the 3D k-space. The volumetric matrix size was set to $110 \times 110 \times 110$. For both phantom and in vivo scans, we used M1-compensated diffusion encoding gradients with a maximum gradient strength of 50 mT/m and a slew rate of 100 T/m/s. These gradient parameters were consistent for both sets of scans.

In the case of the phantom scan, we initially performed a fast prescan acquisition without the tip-up pulse to characterize the eddy current-induced phase differences. Subsequently, we acquired data at three different b-values (b=600 s/mm$^2$, 1000 s/mm$^2$ and 2000 s/mm$^2$) and nine diffusion directions ([Gx, Gy, Gz]: [0.707, 0, 0.707], [−0.707, 0, 0.707], [0, 0.707, 0.707], [0, 0.707, −0.707], [0.707, 0.707, 0], [−0.707, 0.707, 0], [1, 0, 0], [0, 1, 0], [0, 0, 1]) to measure eddy currents. The prescan sequence diagram is depicted in FIG. 3A. Subsequently, using the measured phase differences, we calculated optimized shim currents to compensate for the phase differences. A least squares optimization was used to find shim currents which produce a spatial field profile that approximates the phase different map, but with opposite polarity. Finally, to validate the present compensation method, we acquired data for three diffusion directions ([Gx, Gy, Gz]: [1, 0, 0], [0, 1, 0], [0, 0, 1]) at b=600 s/mm$^2$ with TR/DP-time=500/50 ms.

For in vivo scans, we acquired data for six diffusion directions ([Gx, Gy, Gz]: [0.707, 0, 0.707], [−0.707, 0, 0.707], [0, 0.707, 0.707], [0, 0.707, −0.707], [0.707, 0.707, 0], [−0.707, 0.707, 0]) at b=1000 s/mm$^2$ for diffusion tensor imaging (DTI) model. Additionally, we acquired data for three diffusion directions ([Gx, Gy, Gz]: [1, 0, 0], [0, 1, 0], [0, 0, 1]) with pre-pulse gradients and TR/DP-time=500/60 ms were acquired at b=2000 s/mm$^2$. FOV-matched whole-brain B$_0$ maps (resolution: 2.0 mm×2.0 mm×2.0 mm) were obtained using a 7-second Physical sequence for fast in vivo B$_0$ calibration. To mitigate B$_0$-induced image blurring from the spiral readout, a multi-frequency interpolation (MFI) technique was implemented with conjugate phase demodulation to achieve high image fidelity.

A delay time of 400 ms was utilized after the PG to ensure acquisition during end-diastole in this in vivo study. The specific delay time can be determined from the waveforms of an ECG or pulse oximeter. All experiments were conducted using both a 3 T GE ultra-high-performance (UHP) scanner (GE Healthcare, Madison, WI, USA) and a 3 T Siemens Prisma scanner (Siemens Healthineers, Erlangen, Germany).

Figure 6:
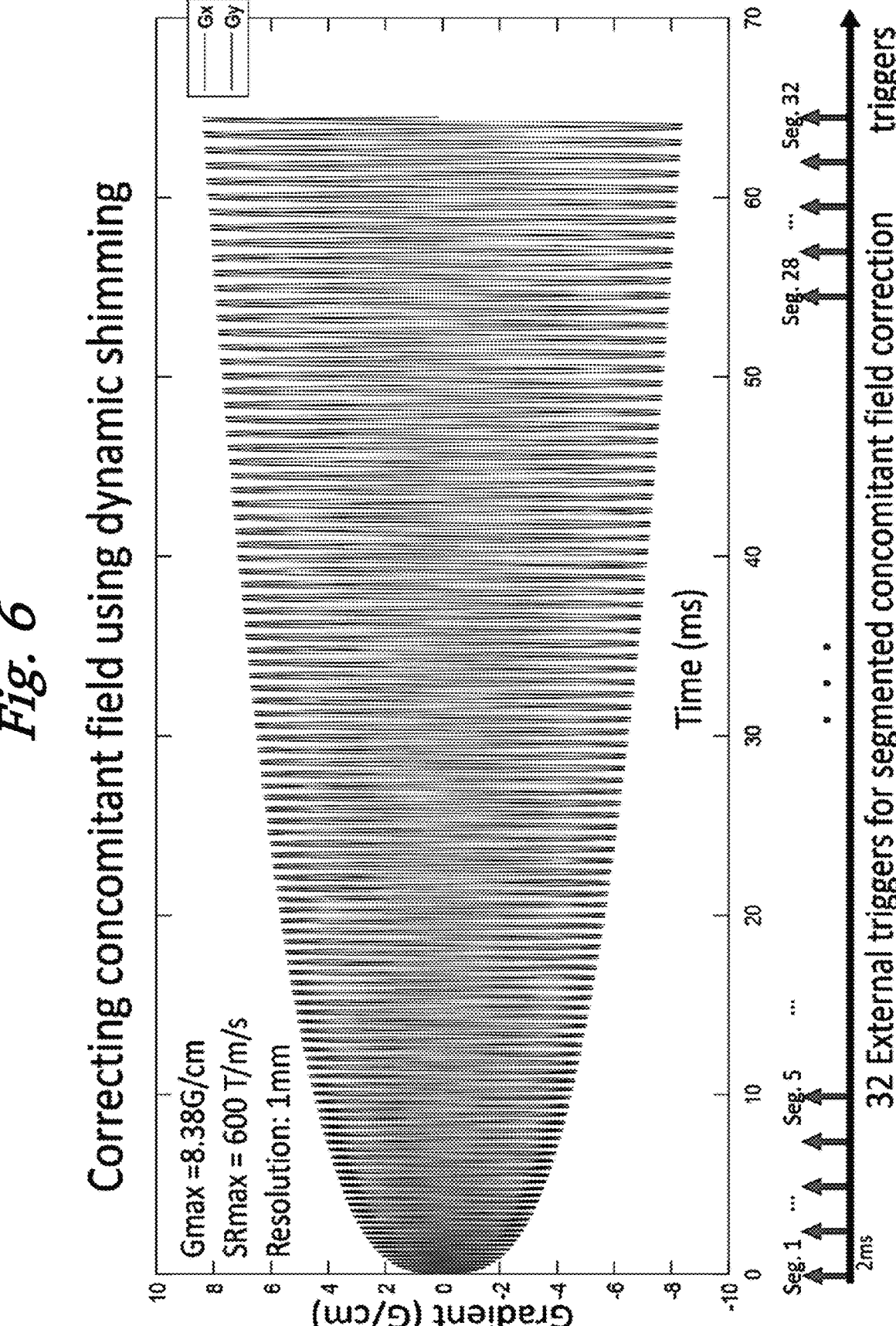
FIG. 6 is a graph of a 2D single-shot spiral readout with maximum slew rate of 600 T/m/s and $G_{max}$ of 8.38 G/cm achievable on high-end head 3T systems. The spiral was time-segmented into 32 segments with 2 ms triggers to calculate phase accrual from concomitant fields and for segmented concomitant field correction.

We also conducted simulations of the concomitant field for a 64 ms single-shot 2D spiral trajectory at 3T using Eq. 1. The trajectory is illustrated in FIG. 6, with the following trajectory design parameters: FOV=220 mm, G$_{max}$=83.8 mT/m, maximum slew rate=600 T/m/s, in-plane resolution=1 mm. To effectively compensate for concomitant fields in simulations, we uniformly divided the 64 ms trajectory into 32 segments and introduced 32 external triggers for the dynamic updating of shim currents using the AC/DC shim-array, as depicted in FIG. 6. Similar to eddy current correction, we conducted simulations and compensated for the concomitant field by continuously updating the optimal shim currents to generate opposite phase accrual every 2 ms.

Results

Figure 7:
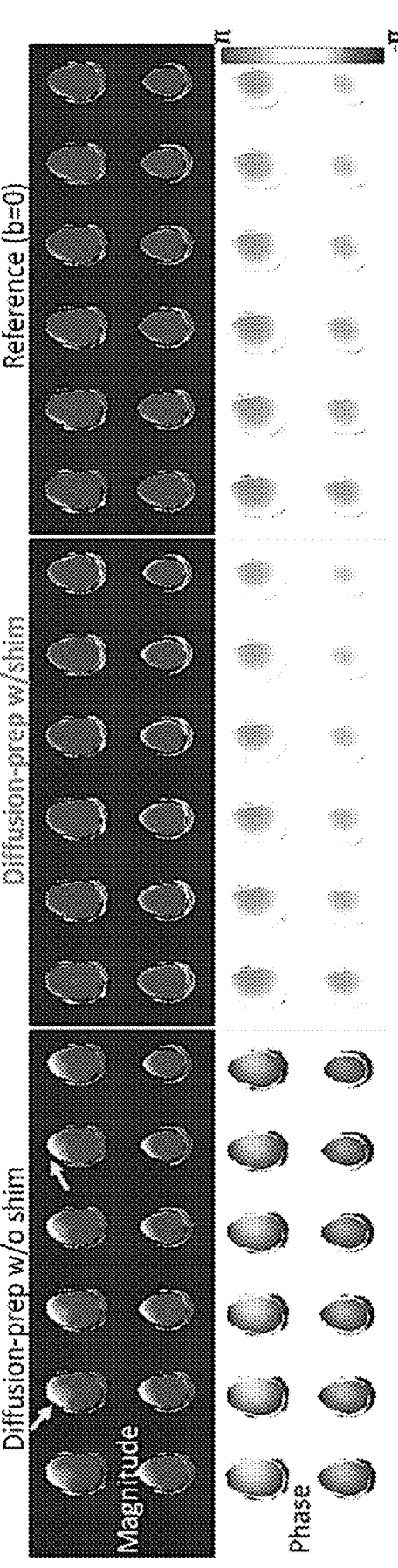
FIG. 7 shows diffusion-prepared (DP) images with and without shim correction. Compared to reference b=0 images, the DP image with shim-correction avoids the undesirable signal loss from eddy current-induced phase error, which is present in the DP images without correction (arrows). With shim-correction, the phase maps of the DP images are similar to reference phase maps.

FIG. 7 displays DP magnitude and phase images acquired from a head-shaped phantom, both with and without shim correction. Without eddy currents correction (first column in FIG. 7), the bias caused by eddy current-induced phase differences leads to signal loss, as indicated by the arrows in the DP images. Conversely, the shim-corrected DP images exhibit higher signal intensities in these regions without any signal dropout. Furthermore, with eddy currents correction, the b=600 s/mm$^2$ DP images (second column in FIG. 7) also show similar phase compared to the reference b=0 DP images (third column in FIG. 7), demonstrating the eddy current-induced phase differences were compensated by shim currents.

Figures 8A, 8B:
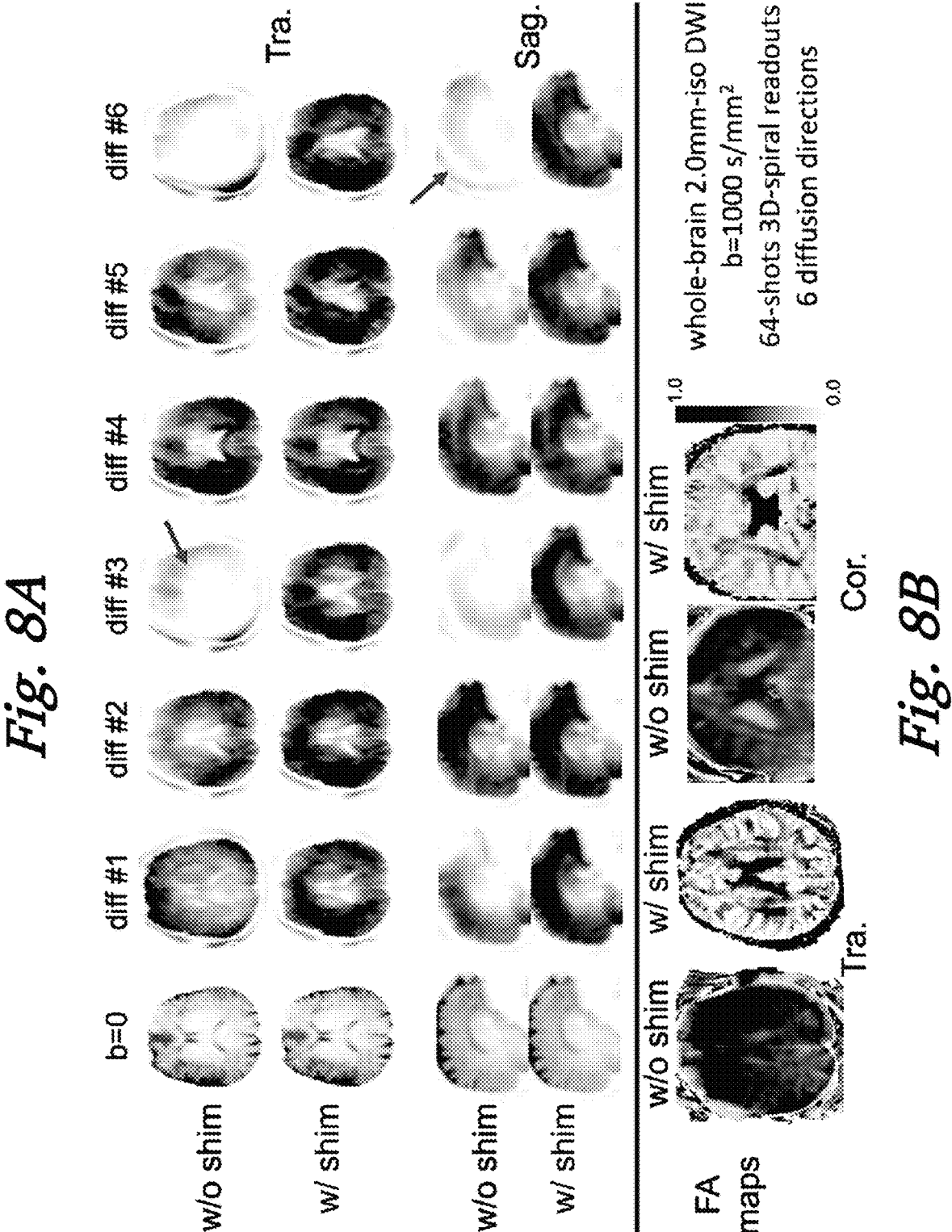
FIG. 8A shows in vivo whole-brain six-diffusion-direction diffusion-prepared (DP) images with and without shim correction at b=1000 s/mm². As arrows indicate, the DP images without any correction contains signal loss while the DP images with shim correction obtain higher signal level and good FA maps.
FIG. 8B shows in vivo whole-brain six-diffusion-direction diffusion-prepared (DP) fractional anisotropy (FA) maps with and without shim correction at b=1000 s/mm².

FIG. 8A presents whole-brain diffusion-weighted images acquired from six diffusion directions and FIG. 8B shows corresponding fractional anisotropy (FA) maps at b=1000 s/mm$^2$, both with and without shim correction. These FA maps were generated by fitting the data from six diffusion directions using the DTI model. Without eddy currents correction, the phase differences induced by eddy currents lead to signal loss, as highlighted by the arrows. However, the shim-corrected images showcase signal recovery in these regions, ultimately resulting in accurate FA maps.

Moreover, FIG. 9 illustrates that the combination of shim and pre-pulse gradient corrections yields superior signal recovery at b=2000 s/mm$^2$ compared to using pre-pulse gradients correction alone, highlighting the efficacy of the present method at high b-values. The pre-pulse gradients employed in the study were calibrated in three axes, ranging from −50 to 50 mT/m to minimize the impact of eddy currents in three diffusion directions. The results clearly show that utilizing pre-pulse gradients alone can mitigate some signal dropouts caused by strong eddy currents associated with diffusion gradients at high b-values. However, certain regions still exhibit signal loss. Therefore, the synergistic use of both pre-pulse gradients and the AC/DC shim-array is necessary to fully compensate for eddy currents in cases involving high b-values, all while maintaining a short diffusion-preparation time.

Figures 10A, 10B:
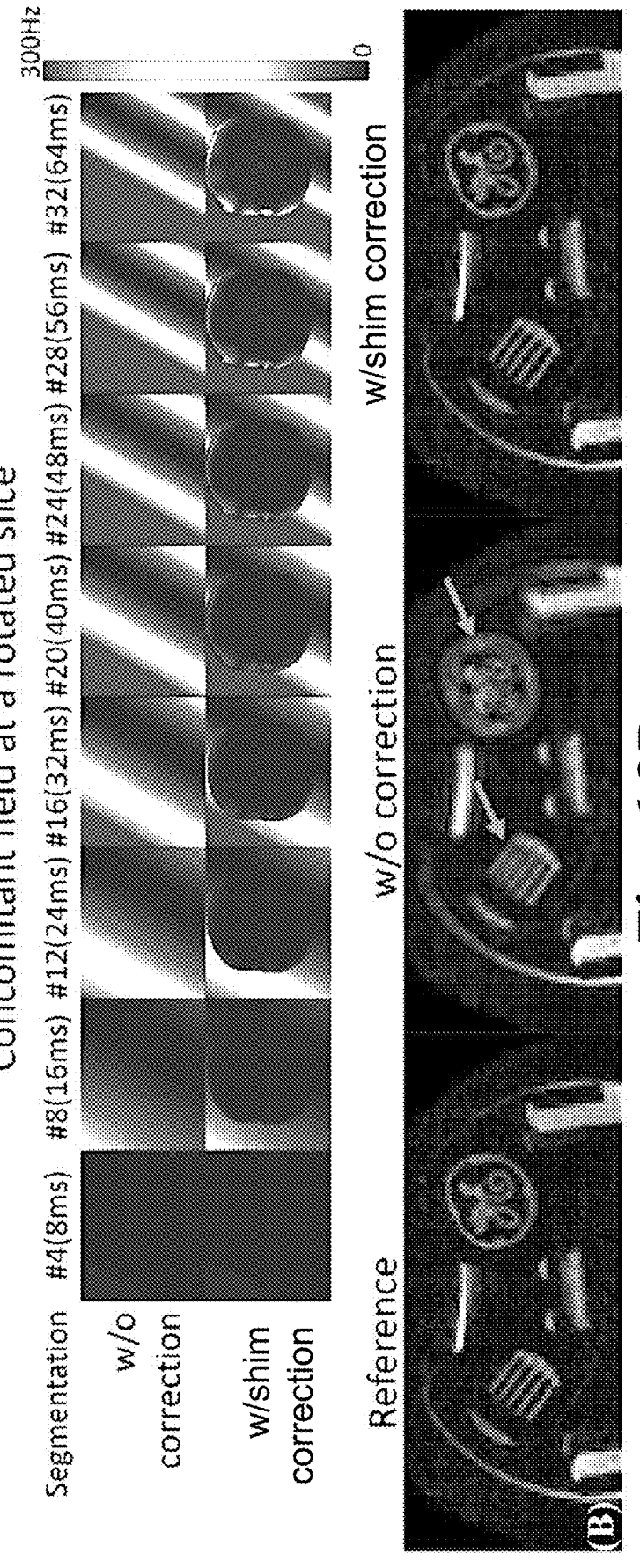
FIG. 10A are images illustrating the concomitant field at Z=+40 mm offset with (10°, 20°) double-oblique rotation.
FIG. 10B show images with and without correction. Without any correction, the concomitant field becomes severe with long readout, which resulted in image blurring, as the arrow indicates. The dynamic shimming could compensate for the concomitant field in the masked regions of interests, which could get sharper images and less blurring.

FIG. 10A shows the concomitant field maps at Z=+40 mm offset with (10°, 20°) double-oblique rotation. The phase accumulation across the long readout duration leads to image blurring in spiral imaging, as shown in the second column of FIG. 10B. With a masked shim correction, the phase accrual within the region of interest (inside the phantom) was effectively compensated for, resulting in sharper images, as depicted in the third column of FIG. 10B.

Discussion

This study provides a comprehensive demonstration of the flexible applicability of the AC/DC shim-array for correcting undesirable eddy currents in diffusion MRI acquisitions. Through a series of phantom and in vivo experiments, we showcase its ability to enable high-fidelity, cardiac-gated, multi-shot 3D diffusion-prepared DTI acquisitions without the need for SNR-compromising magnitude stabilizers. Furthermore, we successfully achieved high-quality acquisitions at a high b-value of 2000 s/mm$^2$ by synergistically combining the shim-array with pre-pulse gradient mitigation strategies to minimize eddy current-induced phase errors in challenging scenarios. Our results highlight successful eddy current mitigation within a 3D DTI acquisition, paving the way for high-quality 3D in vivo diffusion MRI with high SNR. Additionally, our study demonstrates an approach for resolving image degradation resulting from strong concomitant fields. This is particularly valuable in high-performance gradient systems and low-field MRI scanners. Simulation results further highlight the method's effectiveness in mitigating concomitant fields in non-Cartesian trajectories, such as long-readout, high-performance spirals, and double-oblique positions.

Compared to conventional 2D diffusion spin-echo EPI acquisition, 3D DP acquisition offers distinct advantages, including distortion-free images and enhanced SNR efficiency due to shorter TR and volumetric encodings. However, the 3D DP acquisition is sensitive to both physiological noise and eddy current-induced phase errors. These phase errors can lead to magnitude signal dropout following the tip-up pulse. In this study, we successfully mitigated physiological noise-induced phase errors, primarily originating from cardiac pulsations, through the use of cardiac gating and M1 diffusion gradient compensation. Additionally, we used the AC/DC shim array to address eddy current-induced phase errors that cannot be fully corrected using the linear gradients alone. While conventional eddy current nulling techniques have been proposed to minimize eddy currents induced during the EPI readout in diffusion imaging, they may not consistently provide zero phase at specific time points, such as at the timing of the tip-up pulse, potentially leading to signal dropout in DP acquisitions. The introduction of pre-pulse encoding, which uses eddy currents generated by pre-pulse gradients to compensate for eddy currents induced by diffusion encoding while maintaining a short diffusion-preparation time, has been successfully implemented in DTI-MR Fingerprinting with a b-value of 600 s/mm$^2$. However, this method still exhibits limitations in fully compensating for large eddy currents at high b-values, as shown in our experiments at b=2000 s/mm$^2$. In contrast, our present dynamic shim approach enables us to effectively compensate for eddy currents across different diffusion directions, even at high b-values. This innovation overcomes the limitations associated with eddy current correction methods using the pre-pulse method.

In the present work, we employed a calibration scan to directly measure the eddy current-induced phase error precisely at the time point of tip-up and subsequently compensated for it using the AC/DC shim array. This approach eliminates the necessity of estimating time constant coefficients for eddy currents associated with various diffusion gradients. Notably, since eddy currents are subject-independent, the calibration scan was conducted using a phantom. This procedure is a one-time requirement and can be performed before the in vivo scans. This not only saves valuable time but also enhances the feasibility and practicality of implementing the present method for in vivo studies.

To provide an initial demonstration of eddy current correction in the DP acquisition, a single-TE spiral-projection readout was employed in each DP sequence. However, it's important to note that this technique is not limited to a specific readout method and can be applied to other efficient sampling schemes, such as fast-spin-echo and gradient- and spin-echo (GRASE) sequences. The use of a continuous echo-train following diffusion preparation can further enhance the sampling efficiency of the diffusion acquisition, leading to significant reductions in acquisition time. In this study, we were able to achieve a long echo-train length, as we did not utilize a magnitude stabilizer. As depicted in FIG. 2C, when a stabilizer is employed, the signal intensity rapidly decreases in the first 100 TRs. Conversely, in the absence of a stabilizer, the signal intensity in the first 100 TRs remains at a reasonable level.

The magnitude of the concomitant field is inversely proportional to the field strength and directly proportional to gradient strength and off-center locations. This implies that concomitant fields can pose challenges not only in low-field MRI scanners, such as 0.55 T scanners but also in high-field MRI systems operating at 3 T or 7 T, especially those equipped with high-end gradient systems. Previous studies have demonstrated several approaches to compensate for concomitant fields on low-field scanners, symmetric, and asymmetric gradient coils. However, these compensation methods either required extra time for added gradient blips, along with additional phase error correction during image reconstruction, or were only effective for acquisitions with a positional offset along the z-axis. With the present dynamic updating method, we can effectively address the complex concomitant fields associated with oblique acquisition positions, without the sacrifice of scan efficiency. Future research will explore the application of this correction technique to more intricate readout k-space trajectories. In such cases, the undesirable fields obtained using NMR field probes could serve as high-fidelity targets for mitigation, promising further advancements in this area. In future work, the concomitant field nulling method will be experimentally validated using upgraded shim amplifier hardware that can play out arbitrary current waveforms on every channel, eliminating the need for a stepwise approach.

CONCLUSION

In this work, we have introduced a dynamic shim approach utilizing a 46-channel AC/DC shim array hardware. This approach effectively corrects eddy currents arising from diffusion encoding and addresses concomitant fields associated with long trajectories and high gradient strengths. Furthermore, we conducted both phantom and in vivo experiments to showcase the practicality and efficacy of our method. Our results demonstrate the successful implementation of high-fidelity, multi-shot, cardiac-gated, 3D diffusion-prepared DTI acquisitions. Notably, our approach eliminates the need for SNR-compromising amplitude stabilizers. This development offers the potential to significantly enhance the efficiency of 3D diffusion MRI while maintaining high SNR levels.

The invention claimed is:

1. A method for magnetic resonance imaging comprising:
   a) performing a pre-scan calibration comprising a diffusion acquisition and a non-diffusion acquisition, wherein the pre-scan calibration uses a one-time MRI spin-echo pulse sequence to measure phase differences between the diffusion acquisition and the non-diffusion acquisition, wherein the measured phase differences correspond to an estimation of eddy-current-induced phase in a diffusion-prepared sequence;
   b) performing an imaging scan comprising an imaging acquisition, wherein the imaging scan uses arbitrary waveform shim currents applied to a shim array during the imaging acquisition, wherein the shim currents are determined from the measured phase differences from the pre-scan to create phase maps having phase polarity opposite to the measured phase differences in order to compensate eddy-current or system-imperfection-induced phase differences;
   wherein the imaging scan and pre-scan calibration are performed using an MRI apparatus with a channel integrated receiver and the shim array.

2. The method of claim 1 wherein the shim array comprises shim coils having an order higher than first order and second order, or multi-coil shim arrays.

3. The method of claim 1 further comprising:
   c) performing a third scan by applying second arbitrary waveform shim currents to the shim array during a 2D, 3D, and simultaneous multi-slice MRI acquisition, in order to correct phase accrual and image blurring induced by concomitant fields from arbitrary imaging positions.

\* \* \* \* \*